US009431623B2

(12) United States Patent
Kazlas et al.

(10) Patent No.: US 9,431,623 B2
(45) Date of Patent: Aug. 30, 2016

(54) FLEXIBLE DEVICES INCLUDING SEMICONDUCTOR NANOCRYSTALS, ARRAYS, AND METHODS

(75) Inventors: Peter T. Kazlas, Sudbury, MA (US); Marshall Cox, North Haven, CT (US); Seth Coe-Sullivan, Redondo Beach, CA (US); Ioannis Kymissis, New York, NY (US)

(73) Assignee: QD VISION, INC., Lexington, MA (US)

( * ) Notice: Subject to any disclaimer, the term of this patent is extended or adjusted under 35 U.S.C. 154(b) by 15 days.

(21) Appl. No.: 12/851,336

(22) Filed: Aug. 5, 2010

(65) Prior Publication Data

US 2011/0095261 A1    Apr. 28, 2011

Related U.S. Application Data

(63) Continuation of application No. PCT/US2008/013504, filed on Dec. 8, 2008.

(60) Provisional application No. 61/026,967, filed on Feb. 7, 2008.

(51) Int. Cl.
*H01L 51/50* (2006.01)
*B82Y 20/00* (2011.01)
(Continued)

(52) U.S. Cl.
CPC ............... *H01L 51/502* (2013.01); *B82Y 20/00* (2013.01); *H01L 27/3293* (2013.01);
(Continued)

(58) Field of Classification Search
CPC ............ H01L 2251/5338; H01L 51/5237; H01L 51/5253; H01L 51/5259; H01L 51/502
See application file for complete search history.

(56) References Cited

U.S. PATENT DOCUMENTS 4,888,061 A  * 12/1989  Wenz .......................... 136/251
5,469,020 A     11/1995  Herrick
(Continued)

FOREIGN PATENT DOCUMENTS

WO    WO2007095173 A2    8/2007
WO    WO2008063652 A1    5/2008
(Continued)

OTHER PUBLICATIONS

Adachi. C., et al., "High-efficiency red electrophosphorescence devices", *Appl. Phys. Lett.* vol. 78, No. 11, pp. 1622-1624 (2001).
(Continued)

*Primary Examiner* — Tucker J Wright

(57) ABSTRACT

The present invention relates to flexible devices including semiconductor nanocrystals, arrays including such devices, systems including the foregoing, and related methods. In one embodiment, a flexible light-emitting device includes a flexible substrate including a first electrode, an emissive layer comprising semiconductor nanocrystals disposed over the substrate, and second electrode disposed over the emissive layer comprising semiconductor nanocrystals, wherein, when the device is curved, the emissive layer comprising semiconductor nanocrystals lies substantially in the neutral plane of the device. In another embodiment, a light-emitting device includes an emissive layer comprising semiconductor nanocrystals disposed between two flexible substrates, a first electrode disposed over the emissive layer comprising semiconductor nanocrystals, and a second electrode disposed under the emissive layer comprising semiconductor nanocrystals. In certain preferred embodiments, at least one charge transport layer is disposed between one of the electrodes and the layer comprising semiconductor nanocrystals.

27 Claims, 2 Drawing Sheets

Schematic of cross-section of an example of an unpackaged light-emitting device structure.

Light emission

(51) Int. Cl.
 H01L 27/32 (2006.01)
 H01L 51/00 (2006.01)
 H01L 51/52 (2006.01)

(52) U.S. Cl.
 CPC ........ *H01L 51/0037* (2013.01); *H01L 51/5203* (2013.01); *H01L 51/5237* (2013.01); *H01L 51/5246* (2013.01); *H01L 51/5259* (2013.01); *H01L 2251/5338* (2013.01)

(56) References Cited

U.S. PATENT DOCUMENTS

| | | | |
|---|---|---|---|
| 5,512,131 A | 4/1996 | Kumar et al. | |
| 5,537,000 A | 7/1996 | Alivisatos et al. | |
| 5,688,551 A | 11/1997 | Littman et al. | |
| 6,023,073 A | 2/2000 | Strite | |
| 6,027,958 A | 2/2000 | Vu et al. | |
| 6,180,239 B1 | 1/2001 | Whitesides et al. | |
| 6,319,426 B1 | 11/2001 | Bawendi et al. | |
| 6,322,901 B1 | 11/2001 | Bawendi et al. | |
| 6,459,076 B1 | 10/2002 | Schlenker | |
| 6,498,592 B1 | 12/2002 | Matthies | |
| 6,518,168 B1 | 2/2003 | Clem et al. | |
| 6,576,291 B2 | 6/2003 | Bawendi et al. | |
| 6,579,422 B1 | 6/2003 | Kakinuma | |
| 6,611,241 B1 | 8/2003 | Firester et al. | |
| 6,639,643 B2 | 10/2003 | Babuka et al. | |
| 6,710,366 B1 | 3/2004 | Lee et al. | |
| 6,720,942 B2 | 4/2004 | Lee et al. | |
| 6,784,610 B2 | 8/2004 | Ellis | |
| 6,841,949 B2 | 1/2005 | Duggal | |
| 6,853,013 B2 | 2/2005 | Hirai et al. | |
| 6,868,314 B1 | 3/2005 | Frink | |
| 6,891,330 B2 | 5/2005 | Duggal et al. | |
| 6,918,946 B2 | 7/2005 | Korgel et al. | |
| 6,992,317 B2* | 1/2006 | Jain et al. | 257/14 |
| 6,996,147 B2 | 2/2006 | Majumdar et al. | |
| 7,132,635 B2 | 11/2006 | Dowling | |
| 7,132,787 B2 | 11/2006 | Ozkan et al. | |
| 7,160,613 B2 | 1/2007 | Bawendi et al. | |
| 7,190,008 B2 | 3/2007 | Amundson et al. | |
| 7,199,344 B2 | 4/2007 | Blake | |
| 7,255,823 B1 | 8/2007 | Guenther et al. | |
| 7,274,413 B1 | 9/2007 | Sullivan et al. | |
| 7,317,280 B2 | 1/2008 | Qiu et al. | |
| 7,326,908 B2 | 2/2008 | Sargent et al. | |
| 7,332,211 B1 | 2/2008 | Bulovic et al. | |
| 7,700,200 B2 | 4/2010 | Bulovic et al. | |
| 7,733,310 B2 | 6/2010 | Hajjar et al. | |
| 7,750,352 B2 | 7/2010 | Thurk | |
| 7,888,700 B2 | 2/2011 | Kahen | |
| 8,232,722 B2 | 7/2012 | Bawendi et al. | |
| 8,264,431 B2 | 9/2012 | Bulovic et al. | |
| 8,373,211 B2 | 2/2013 | Amundson et al. | |
| 8,405,063 B2 | 3/2013 | Kazlas et al. | |
| 8,470,617 B2 | 6/2013 | Coe-Sullivan et al. | |
| 8,536,776 B2 | 9/2013 | Wood et al. | |
| 8,610,232 B2 | 12/2013 | Coe-Sullivan et al. | |
| 2002/0001046 A1 | 1/2002 | Jacobsen et al. | |
| 2003/0151569 A1* | 8/2003 | Lee et al. | 345/84 |
| 2004/0004609 A1 | 1/2004 | Holman | |
| 2004/0023010 A1* | 2/2004 | Bulovic et al. | 428/209 |
| 2004/0151461 A1 | 8/2004 | Hill | |
| 2004/0252488 A1 | 12/2004 | Thurk | |
| 2005/0058416 A1 | 3/2005 | Hoon Lee et al. | |
| 2005/0116621 A1 | 6/2005 | Bellmann et al. | |
| 2005/0116633 A1 | 6/2005 | Yamazaki et al. | |
| 2005/0155704 A1* | 7/2005 | Yokajty et al. | 156/295 |
| 2005/0258418 A1 | 11/2005 | Steckel et al. | |
| 2005/0274944 A1 | 12/2005 | Jang et al. | |
| 2006/0063029 A1 | 3/2006 | Jang et al. | |
| 2006/0097264 A1 | 5/2006 | Kim et al. | |
| 2006/0132025 A1* | 6/2006 | Gao et al. | 313/503 |
| 2006/0132027 A1* | 6/2006 | Gao | 313/506 |
| 2006/0132030 A1* | 6/2006 | Gao et al. | 313/511 |
| 2006/0196375 A1 | 9/2006 | Coe-Sullivan et al. | |
| 2006/0204675 A1* | 9/2006 | Gao et al. | 428/1.1 |
| 2006/0273304 A1* | 12/2006 | Cok | 257/40 |
| 2007/0001581 A1* | 1/2007 | Stasiak et al. | 313/498 |
| 2007/0103068 A1 | 5/2007 | Bawendi et al. | |
| 2007/0154735 A1 | 7/2007 | Nakayama | |
| 2007/0170446 A1* | 7/2007 | Cho et al. | 257/98 |
| 2007/0200492 A1 | 8/2007 | Cok et al. | |
| 2007/0247061 A1 | 10/2007 | Adamovich et al. | |
| 2008/0001167 A1 | 1/2008 | Coe-Sullivan et al. | |
| 2008/0030126 A1 | 2/2008 | Scholz et al. | |
| 2008/0074050 A1 | 3/2008 | Chen et al. | |
| 2008/0157656 A1* | 7/2008 | Liao et al. | 313/504 |
| 2008/0169753 A1 | 7/2008 | Skipor et al. | |
| 2008/0172197 A1 | 7/2008 | Skipor et al. | |
| 2009/0017268 A1 | 1/2009 | Skipor et al. | |
| 2009/0039764 A1 | 2/2009 | Cho et al. | |
| 2009/0109435 A1* | 4/2009 | Kahen et al. | 356/317 |
| 2009/0181478 A1 | 7/2009 | Cox et al. | |
| 2009/0208753 A1 | 8/2009 | Coe-Sullivan et al. | |
| 2009/0215208 A1 | 8/2009 | Coe-Sullivan et al. | |
| 2009/0215209 A1 | 8/2009 | Anc et al. | |
| 2009/0278141 A1 | 11/2009 | Coe-Sullivan et al. | |
| 2009/0280586 A1 | 11/2009 | Coe-Sullivan | |
| 2009/0283742 A1 | 11/2009 | Coe-Sullivan et al. | |
| 2009/0283743 A1 | 11/2009 | Coe-Sullivan et al. | |
| 2009/0283778 A1 | 11/2009 | Coe-Sullivan et al. | |
| 2009/0286338 A1 | 11/2009 | Coe-Sullivan et al. | |
| 2010/0051870 A1 | 3/2010 | Ramprasad | |
| 2010/0051901 A1 | 3/2010 | Kazlas et al. | |
| 2010/0052512 A1 | 3/2010 | Clough et al. | |
| 2010/0068468 A1 | 3/2010 | Coe-Sullivan et al. | |
| 2010/0132770 A1 | 6/2010 | Beatty et al. | |
| 2010/0134520 A1 | 6/2010 | Coe-Sullivan et al. | |
| 2010/0283014 A1 | 11/2010 | Breen et al. | |
| 2014/0030507 A1 | 1/2014 | Yoshida et al. | |

FOREIGN PATENT DOCUMENTS

| | | |
|---|---|---|
| WO | WO2009099425 A2 | 8/2009 |
| WO | WO2009099425 A3 | 8/2009 |

OTHER PUBLICATIONS

Bulovic, V., et al., "Molecular Organic Light-Emitting Devices", *Semiconductors and Semimetals,* vol. 64, pp. 255-307 (2000).

Coe-Sullivan, S., et al., "Large-Area Ordered Quantum-Dot Monolayers via Phase Separation During Spin-Casting", *Adv. Funct. Mater.,* vol. 15 (2005), pp. 1117-1124.

Coe-Sullivan, S., "The Application of Quantum Dots in Display Technology", *Material Matters,* vol. 2, No. 1, pp. 13-14 (Sigma-Aldrich 2007).

Coe-Sullivan, S., et al., "Electroluminescence from single monolayers of nanocrystals in molecular organic devices", *Nature,* vol. 420, 19/26, Dec. 2002, pp. 800-803.

Coe-Sullivan, S., et al., "Tuning the performance of hybrid organic/inorganic quantum dot light-emitting devices", *Organic Electronics,* vol. 4 (2003), pp. 123-130.

Coe-Sullivan, S., "Hybrid Organic/Quantum Dot Thin Film Structures and Devices", MIT Thesis in partial fulfillment of Ph.D. in Electrical Engineering and Computer Science (2005).

Coe-Sullivan, S., et al., "Method for fabrication of saturated RGB quantum dot light emitting devices", Proc. Of SPIE, vol. 5739 (2005), pp. 108-115.

Dabbousi, B. O., Et al., "(CdSe)ZnS Core-Shell Quantum Dots: Synthesis and Characterization of a Size Series of Highly Luminescent Nanocrystallites", *J. Phys. Chem. B* 1997, vol. 101, p. 9463.

D'Andrade, B., et al., "Symposium BB Organic Optoelectronic Materials, Processing, and Devices", BB6.2, *MRS Fall Meeting,* Nov. 25-30, 2001.

Dirr, S., et al., "Organic Light Emitting Diodes with Reduced Spectral and Spacial Halfwidths", *Jpn. J. Appl. Phys.* vol. 37, pp. 1457-1461 (1998).

Howard, C., "BAE Systems applies military technology to commercial airliner defense system", *Military & Aerospace Electronics,* vol. 17, No. 10 (2006).

(56) References Cited

OTHER PUBLICATIONS

Ichikawa, M., et al., "Bipyridyl oxadiazoles as efficient and durable electron-transporting and hole-blocking molecular materials", *J. Mater. Chem.*, 2006, vol. 16, pp. 221-225.

Lin, X.M., et al., "Formation of Long-Range-Ordered Nanocrystal Superlattices on Silicon Nitride Substrates", *J. Phys. Chem. B,* vol. 105, pp. 3353-3357, (2001).

Moeller, G., et al., "Quantum-Dot Light-Emitting Devices for Displays", *Information Display,* vol. 2 (2006), pp. 2-6.

Murray, C.B., et al., "Synthesis and Characterization of Nearly Monodisperse CdE (E = S, Se, Te) Semiconductor Nanocrystallites", *J. Am. Chem. Soc.,* 115:8706 (1993).

Murray, C.B., "Synthesis and Characterization of II-VI Quantum Dots and Their Assembly into 3-D Quantum Dot Superlattices", Massachusetts Institute of Technology, Thesis, Sep. 1995.

PCT International Search Report and Written Opinion, mailed May 22, 2009, in International Application No. PCT/US2008/013504 of QD Vision, Inc.

Santhanam, V., et al., "Self-Assembly of Uniform Monolayer Arrays of Nanoparticles", *Langmuir,* vol. 19, pp. 7881-7887, (2003).

Santhanam, V., et al., "Microcontact Printing of Uniform Nanoparticle Arrays" *Nano Letters*, vol. 4, pp. 41-44, (2004).

Schlamp, M.C. et al., "Improved efficiencies in light emitting diodes made with CdSe(CdS) core/shell type nanocrystals and a semiconducting polymer", *J. Appl. Phys.,* vol. 82, No. 11, pp. 5837-5842, 1997.

Yamasaki et al., "Organic light-emitting device with an ordered monolayer of silica microspheres as a scattering medium", *Appl. Phys. Lett.,* vol. 76, pp. 1243-1245 (2000).

Coe-Sullivan, QD Vision, Inc., "Contact Printing of Quantum Dot/Organic Hybrid Light Emitting Devices for Flexible Displays" presentation dated Feb. 7, 2007 for Flex Displays & Microelectronics.

Coe-Sullivan, QD Vision, Inc., "Quantum Dot Light Emitting Devices: A Novel Light Source for Displays, Lighting and Photonic Applications" presentation dated Mar. 19, 2007 for FPD International Pre-Seminar 2007. 34 pgs.

Kazlas, P.T., et al., Poster Presentation, "Progress in Developing High Efficiency Quantum Dot Displays", *SID Symposium*, May 2007.

Kazlas, P.T., et al., "Progress in Developing High Efficiency Quantum Dot Displays", *SID Symposium Digest of Technical Papers*, May 2007, vol. 38, Issue 1, pp. 856-859.

Tang, et al., "Organic electroluminescent diodes", *AppL Phys. Lett.* (1987), vol. 51, No. 12, pp. 913-915.

* cited by examiner

Schematic of cross-section of an example of an unpackaged light-emitting device structure.

An example of a lighted flexible, white light-emitting device operating a 9 Volts.

FLEXIBLE DEVICES INCLUDING SEMICONDUCTOR NANOCRYSTALS, ARRAYS, AND METHODS

This application is a continuation of commonly owned International Application No. PCT/US2008/013504 filed 8 Dec. 2008, which was published in the English language as PCT Publication No. WO2009/099425 on 13 Aug. 2009, which International Application claims priority to U.S. Application No. 61/026,967 filed 7 Feb. 2008; each of the foregoing hereby being incorporated herein by reference in its entirety.

FEDERALLY SPONSORED RESEARCH OR DEVELOPMENT

This invention was made with Government support under FA9550-06-C-128 awarded by the United States Air Force. The Government has certain rights in the invention.

TECHNICAL FIELD OF THE INVENTION

The present invention relates to the technical field of devices including semiconductor nanocrystals.

SUMMARY OF THE INVENTION

The present invention relates to devices including semiconductor nanocrystals, arrays including such devices, systems including the foregoing, and related methods. In certain embodiments, the devices comprise light-emitting devices.

In accordance with one aspect of the invention, there is provided a light-emitting device including an emissive layer comprising semiconductor nanocrystals disposed between two flexible substrates, a first electrode disposed over the emissive layer comprising semiconductor nanocrystals, and a second electrode disposed under the emissive layer comprising semiconductor nanocrystals. In certain preferred embodiments, at least one charge transport layer is disposed between one of the electrodes and the layer comprising semiconductor nanocrystals. In certain embodiments, the emissive layer is patterned. In certain embodiments, the emissive layer is unpatterned.

In accordance with another aspect of the invention, there is provided a light-emitting device including an emissive layer comprising semiconductor nanocrystals disposed between two flexible substrates, a first electrode disposed over the emissive layer comprising semiconductor nanocrystals, a second electrode disposed under the emissive layer comprising semiconductor nanocrystals, and a third electrode layer disposed on the outside surface of either flexible substrate making electrical contact with either or both interior electrodes through a substrate via or external connection. In certain preferred embodiments, at least one charge transport layer is disposed between one of the electrodes and the layer comprising semiconductor nanocrystals. In certain embodiments, the emissive layer is patterned. In certain embodiments, the emissive layer is unpatterned.

In accordance with another aspect of the invention, there is provided a flexible light-emitting device including: a flexible substrate, a first electrode disposed over a portion of the flexible substrate, an emissive layer comprising semiconductor nanocrystals disposed over the first electrode, and second electrode disposed over the emissive layer comprising semiconductor nanocrystals, wherein, when the device is curved, the emissive layer comprising semiconductor nanocrystals lies substantially in the neutral plane of the device. In certain embodiments, the emissive layer is patterned. In certain embodiments, the emissive layer is unpatterned. In certain embodiments, the device further includes a third electrode layer disposed on the outside surface of the flexible substrate making electrical contact with either or both interior electrodes through a substrate via or external connection.

In accordance with another aspect of the invention, there is provided a flexible light-emitting device including an emissive layer comprising semiconductor nanocrystals disposed between two flexible substrates, a first electrode disposed over the emissive layer comprising semiconductor nanocrystals and a second electrode disposed under the emissive layer comprising semiconductor nanocrystals, wherein, when the device is curved, the emissive layer comprising semiconductor nanocrystals lies substantially in the neutral plane of the device. In certain embodiments, the emissive layer is patterned. In certain embodiments, the emissive layer is unpatterned. In certain embodiments, the device further includes a third electrode layer disposed on the outside surface of either flexible substrate making electrical contact with either or both interior electrodes through a substrate via or external connection.

In certain embodiments of a flexible light-emitting device in accordance with certain aspects of the invention, the module of the various components or parts of the device are such that, when the device is curved, the neutral axis or neutral plane (i.e., the axis or plane in which no compression or tension exists) lies substantially in the plane of the emissive layer. In certain embodiments, the neutral axis or neutral plane does not deviate from the plane of the emissive layer by more than about 25 percent of the total thickness of the device. In certain embodiments, the neutral axis or neutral plane does not deviate from the plane of the emissive layer by more than about 20 percent of the total thickness of the device. In certain embodiments, the neutral axis or neutral plane does not deviate from the plane of the emissive layer by more than about 15 percent of the total thickness of the device. In certain embodiments, the neutral axis or neutral plane does not deviate from the plane of the emissive layer by more than about 10 percent of the total thickness of the device. In certain embodiments, the neutral axis or neutral plane does not deviate from the plane of the emissive layer by more than about 5 percent of the total thickness of the device. In certain embodiments, the neutral axis or neutral plane does not deviate from the plane of the emissive layer by more than about 1 percent of the total thickness of the device.

In accordance with another aspect of the invention, there is provided a method for making a light-emitting device. The method comprises depositing a layer of flexible sealant over exposed (e.g., top and side) surfaces of device layers disposed on a surface of a substrate, and disposing a protective layer over the sealant. In certain embodiments, the layer of flexible sealant and/or protective layer also covers a portion of the substrate surface not covered by the device layers. In certain embodiments, the layer of flexible sealant and/or protective layer comprises a continuous layer over the exposed surfaces of the device layers and the portion of the substrate surface not covered by the device layers. In certain embodiments, the protective layer provides mechanical protection, e.g., against abrasion, handling, other external factors, etc. In certain embodiments, gettering material is associated with (e.g., disposed on, over, under, adjacent, etc.) the device layers before the sealant is disposed thereover. In certain embodiments, gettering material is disposed over at least a portion of an exposed surface of the device layers. In certain embodiments, gettering material is disposed over at least a portion of the substrate between the bottom device layer and the substrate. In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the emissive layer is patterned. In certain embodiments, the emissive layer is unpatterned. In certain embodiments, the substrate is flexible.

In accordance with another aspect of the invention, there is provided a light-emitting device comprising a layer of flexible sealant disposed over exposed (e.g., top and side) surfaces of device layers disposed on surface of a substrate, and a protective layer disposed over the sealant. In certain embodiments, the layer of flexible sealant and/or protective layer also covers a portion of the substrate surface not covered by the device layers. In certain embodiments, the layer of flexible sealant and/or protective layer comprises a continuous layer over at least the exposed surfaces of the device layers and the portion of the substrate surface not covered by the device layers. In certain embodiments, the protective layer provides mechanical protection, e.g., against abrasion, handling, other external factors, etc. In certain embodiments, gettering material is associated with (e.g., disposed on, over, under, adjacent, etc.) the device layers before the sealant is disposed thereover. In certain embodiments, gettering material is disposed over at least a portion of an exposed surface of the device layers. In certain embodiments, gettering material is disposed over at least a portion of the substrate between the bottom device layer and the substrate. In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the light-emitting device comprises one of the devices taught herein. In certain embodiments, the emissive layer is patterned. In certain embodiments, the emissive layer is unpatterned. In certain embodiments, the substrate is flexible.

In accordance with another aspect of the invention, there is provided a method for making a light-emitting device. The method comprises depositing a layer of flexible sealant over a substrate including device layers thereon, and disposing a protective layer over the sealant. In certain embodiments, the protective layer provides mechanical protection, e.g., against abrasion, handling, other external factors, etc. In certain embodiments, gettering material is associated with (e.g., disposed on, over, under, adjacent, etc.) the device layers before the sealant is disposed over the device layers. In certain embodiments, gettering material is disposed over at least a portion of an exposed surface of the device layers. In certain embodiments, gettering material is disposed on at least a portion of the substrate between the substrate and the bottom device layer. In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the emissive layer is patterned. In certain embodiments, the emissive layer is unpatterned. In certain embodiments, the substrate is flexible.

In accordance with another aspect of the invention, there is provided a light-emitting device including a layer of flexible sealant over a substrate including device layers thereon, and a protective layer disposed over the sealant. In certain embodiments, the protective layer provides mechanical protection, e.g., against abrasion, handling, other external factors, etc. In certain embodiments, gettering material associated with (e.g., disposed on, over, under, adjacent, etc.) the device layers before the sealant layer is disposed over the substrate including device layers thereon. In certain embodiments, gettering material is disposed over at least a portion of an exposed surface of the device layers. In certain embodiments, gettering material is disposed over at least a portion of the substrate between the substrate and the bottom device layer. In certain embodiments, gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the light-emitting device comprises one of the devices taught herein. In certain embodiments, the emissive layer is patterned. In certain embodiments, the emissive layer is unpatterned. In certain embodiments, the substrate is flexible.

In accordance with another aspect of the invention, there is provided a method for making a light-emitting device. The method comprises forming a sealant dam around the perimeter of device layers on a substrate to form a defined area, depositing a flexible sealant over the defined area, and disposing a protective layer over at least the uppermost surface of the sealant dam and sealant. In certain embodiments, the protective layer provides mechanical protection, e.g., against abrasion, handling, other external factors, etc. In certain embodiments, gettering material is associated with (e.g., disposed on, over, under, adjacent, etc.) the device layers before the sealant is deposited over the defined area. In certain embodiments, gettering material is disposed over at least a portion of an exposed surface of the device layers. In certain embodiments, gettering material is disposed over at least a portion of the substrate between the substrate and the bottom device layer. In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the emissive layer is patterned. In certain embodiments, the emissive layer is unpatterned. In certain embodiments, the substrate is flexible.

In accordance with another aspect of the invention, there is provided a light-emitting device including a sealant dam around the perimeter or device layers on a substrate to form a defined area, and a flexible sealant covering the defined area and at least the uppermost surface of the sealant dam. In certain embodiments, gettering material is associated with (e.g., disposed on, over, under, adjacent, etc.) the device layers before the sealant is included. In certain embodiments, gettering material is disposed over at least a portion of an exposed surface of the device layers. In certain embodiments, gettering material is disposed over at least a portion of the substrate between the substrate and the bottom device layer.

In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the light-emitting device comprises one of the devices taught herein. In certain embodiments, the emissive layer is patterned. In certain embodiments, the emissive layer is unpatterned. In certain embodiments, the substrate is flexible.

In accordance with another aspect of the invention, there is provided an array comprising two or more of one of the devices taught herein, wherein the devices are in electrical connection (e.g., direct or indirect). In certain preferred embodiments, the two or more devices are mounted on a flexible printed circuit board. In certain preferred embodiments, the two or more devices are electrically connected by way of the flexible printed circuit board. In certain embodiments, the flexible circuit board is further laminated to a surface.

In accordance with another aspect of the invention, there is provided a system including a light-emitting device taught herein and a sensor, wherein the sensor is in electrical connection (e.g., direct or indirect) with an electronic circuit which is also in electrical connection (e.g., direct or indirect) with the light-emitting device. In certain embodiments, the sensor is in close proximity to the light-emitting device.

In certain embodiments, the sensor comprises an optical sensor. In certain embodiments, the sensor comprises a temperature sensor. In certain embodiments, the sensor comprises a photoconductor. In certain embodiments, the sensor comprises a radio frequency sensor. In certain embodiments, the sensor comprises a capacitive sensor. In certain embodiments, the sensor is a color sensor. In certain embodiments, the sensor comprises a chemical sensor. In certain embodiments, the sensor comprises a biological sensor. In certain embodiments, the sensor comprises an acoustic sensor.

In certain embodiments, the sensor comprises more than one sensor.

In certain embodiments, the sensor comprises more than one type of sensor.

In certain embodiments, the sensor is on the same surface of the flexible substrate as the light-emitting device. In certain of such embodiments wherein the sensor is optically sensitive, the sensor can collect light from the same surface of the flexible substrate as the light-emitting device.

In certain embodiments, the sensor is on the opposite side of the substrate from the light-emitting device. In certain of such embodiments wherein the sensor is optically sensitive, the sensor can collect light from the opposite side of the substrate from the light-emitting device.

In certain embodiments, the sensor is adjacent to the light-emitting device. In certain of such embodiments wherein the sensor is optically sensitive, the sensor collects light adjacent to the light-emitting device.

In certain embodiments, the sensor is located remotely from the light-emitting device, and communicates with the light-emitting device electronically. Such embodiment can be useful, for example, when an opaque body is located between the light-emitting device and the sensor.

In certain embodiments wherein the sensor is optically sensitive, the sensor includes a narrow-band optical filter. In certain embodiments, the sensor includes a wide-band optical filter. In certain embodiments wherein the sensor is optically sensitive, the sensor may include more than one optical sensor, each of which can include a different optical filter that is either narrow- or wide-band to sense the color of the light being monitored. In certain embodiments, each optical sensor can includes the same optical filter, which can be narrow-band or wide-band to sense the color of the light being monitored. In certain embodiments, ambient light is being monitored.

In certain embodiments, the electronic circuit controls the brightness level of the light-emitting device. In certain embodiments, the electronic circuit controls the color of the light-emitting device. In certain embodiments, the electronic circuit controls both the brightness level and color of the light-emitting device.

In certain embodiments, the electronic circuit comprises an amplifier that controls light-emitting device brightness. In certain embodiments, the electronic circuit comprises one or more transistors. In certain embodiments, the electronic circuit comprises one or more passive elements such as a resistor, capacitor or inductor.

In certain embodiments, the system further includes a controller coupled to the light-emitting device and at least one sensor, the controller being configured to process information acquired by the sensor to control the light-emitting device to generate a light output with at least one predetermined characteristic. In certain embodiments, a predetermined characteristic can comprise color, brightness, or other light characteristic.

In certain embodiments, the system is associated with a product or other item. In certain embodiments, a system can be fixedly or removable mounted or attached to a product or other item.

In accordance with another aspect of the invention, there is provided a tile comprising one of the devices taught herein. In certain embodiments, the tile is flexible. In certain preferred embodiments, a tile comprises one or more of the devices taught herein mounted on a flexible printed circuit board. In certain preferred embodiments, the one or more devices are electrically connected by way of the flexible printed circuit board. In certain embodiments, the flexible circuit board is further laminated to a surface. Such tile can further be included in the above-described system.

In accordance with another aspect of the invention, there is provided an array comprising two or more of one of the tiles taught herein, wherein the tiles are in electrical connection. In certain embodiments, the array can be a two-dimensional array of such tiles. In certain embodiments, the array can be a one-dimensional array of such tiles. In certain embodiments, the array can be completely populated with tiles, e.g., the array of tiles is completely filled. In certain embodiments, the array can be incompletely filled with tiles and contiguous, the array can be incompletely filled with tiles and not contiguous.

Such array can further be included in the above-described system.

The foregoing, and other aspects described herein all constitute embodiments of the present invention.

As used herein, "light" refers to electromagnetic radiation of any wavelength, whether visible or not.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

The attached figures are simplified representations presented for purposes of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

Figure 1:
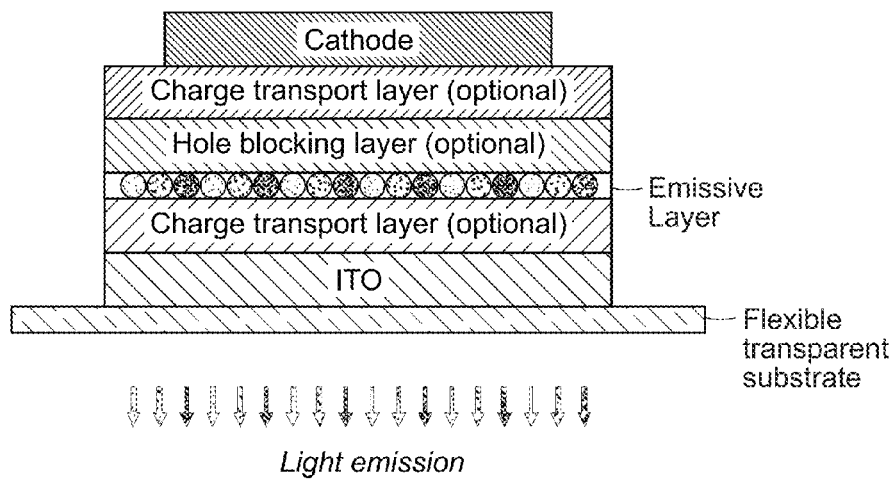
FIG. 1 schematically illustrates the cross-section of an example of an unpackaged light-emitting device structure useful in embodiments of the inventions taught herein.

FIG. 1 schematically depicts the cross-section of an example of an embodiment of a light-emitting device structure useful in various embodiments of the inventions taught herein. The depicted example is not packaged (e.g., is not encapsulated). The illustrated example includes a transparent flexible substrate. The depicted example includes a bottom light-emitting device architecture. In other embodiments in which the light is to be emitted from the top, the substrate may optionally be non-transparent.

In certain embodiments, a light-emitting device can further include a second flexible substrate over the device layers.

In certain embodiments, there is provided a flexible light-emitting device including: a flexible substrate, a first electrode disposed over a portion of the flexible substrate, an emissive layer comprising semiconductor nanocrystals disposed over the first electrode, and second electrode disposed over the emissive layer comprising semiconductor nanocrystals, wherein, when the device is curved, the emissive layer comprising semiconductor nanocrystals lies substantially in the neutral plane of the device.

Examples of suitable flexible substrate materials include, but are not limited to, polyethylene terephthalate (PET), polyethylene naphthalate (PEN) and polyethersulfone (PES), Flexible glass, polyetherketone (PEK), polycarbonate (PC), polypropylene (PP), polyamide (PA), polyacrylate (PAC), aliphatic cyclic polyolefin, and norbornene thermoplastic transparent resin. In certain embodiments, a flexible substrate can comprise a layered structure made of suitable flexible materials. Other suitable flexible substrate materials, transparent or non-transparent, can be readily ascertained by one of ordinary skill in the art. Examples of nontransparent, flexible substrates materials include, but are not limited to metal backed plastic substrates and polyimide. A preferred substrate material is polyethylene terephthalate (PET) with an incorporated inorganic barrier layer such as such as an aluminum film (for example, AlON, AlN, or AlO), a carbon film (such as a DLC (diamond-like carbon) film), or a silicon nitride or silicon oxide film in a single-layer structure or a multilayer structure over a surface of the flexible substrate or over the surface and a rear surface thereof.

In the depicted example, a first electrode (shown as an anode comprising indium tin oxide (ITO)) is disposed over the substrate. Other suitable anode materials include, e.g., other high work function (e.g., greater than 4.0 eV) hole-injecting conductors. Examples include, but are not limited to, tungsten, nickel, cobalt, platinum, palladium and their alloys, gallium indium tin oxide, zinc indium tin oxide, titanium nitride, polyaniline, or other high work function hole-injection conducting polymers.

ITO is an example of a preferred electrode material for a bottom light emitting device due to its light-transmissive properties. In addition to ITO, examples of other light-transmissive electrode materials include conducting polymers, and other metal oxides, low or high work function metals, conducting epoxy resins, or carbon nanotubes/polymer blends or hybrids that are at least partially light transmissive. An example of a conducting polymer that can be used as an electrode material is poly(ethlyendioxythiophene), sold by Bayer AG under the trade mark PEDOT. Other molecularly altered polythiophenes are also conducting and could be used, as well as emaraldine salt form of polyaniline.

A substrate including a first electrode (e.g., an anode) disposed thereon may be obtained or fabricated using any suitable technique. For example, commercially available transparent conducting films from Delta Technologies and TetoLight (Japan) are particularly well-suited for use in fabricating devices in accordance with the invention. Such commercially available films exhibit moderate flexure and show no visible cracking after device fabrication.

In certain embodiments, a light-emitting device can optionally include additional layers, e.g., charge transport layers, hole blocking layers, hole injection layers, etc. The depicted example shows optional charge transport layers over and under the emissive layer and also an optional hole blocking layer between the emissive layer and cathode.

The emissive layer includes semiconductor nanocrystals.

The emissive layer can comprise one or more separate layers. In certain other embodiments, the emissive material can be included in a layer comprising a matrix material.

In certain embodiments, semiconductor nanocrystals included in the emissive layer can be excited by electrical excitation to generate light (electroluminescent (EL) mode). In certain other embodiments, the emissive layer may include semiconductor nanocrystals and a second light-emitting material (including, for example, but not limited to, a light-emitting polymer (e.g., an organic light-emitting polymer such as those used in fabricating organic light emitting devices (OLEDs), a light emitting small organic molecule composition, or other light-emitting material (organic or inorganic)), wherein the second light emitting material generates light upon electrical excitation. The light generated by the second light emitting material can then optically excite the semiconductor nanocrystals to generate light (photoluminescent (PL) mode) of a predetermined wavelength, which is preferably different from the wavelength generated by the second light-emitting material. For example, when a blue emitting organic light emitting polymer (e.g., Lumation BP105 and Lumation BP361 polymer material from Sumation Co., Ltd.) is used, a full or partial layer of semiconductor nanocrystals can be disposed thereover to convert at least a portion of the blue light to light of a predetermined color. In certain embodiments, the emissive layer can comprise a full or partial layer of semiconductor nanocrystals. Such layer can be patterned or unpatterned. In certain embodiments, the pattern comprises an arrangement which permits converted and unconverted light to be emitted. In certain embodiments, the semiconductor nanocrystals can be dispersed in the second light-emitting material. In certain embodiments, a charge transport material can comprise the second light-emitting material.

Preferably the semiconductor nanocrystals comprise a substantially monodisperse population of nanocrystals. An emissive layer comprising semiconductor nanocrystals can be included in a device by spin-casting a dispersion including semiconductor nanocrystals and a volatilizable liquid on an layer of the device. Other techniques, including, but not limited to, e.g., phase separation, drop-casting, Langmuir-Blodgett techniques, contact printing, screen-printing, and other techniques known or readily identified by one skilled in the relevant art, may also be used for forming the emissive layer in the device. Examples of semiconductor nanocrystals and other related information are included below.

Other optional layers (e.g., charge transport layer (e.g., comprising a material capable of transporting holes or electrons), hole blocking layers, hole injection layers, etc.) may be deposited using any suitable technique. Examples of such layers and materials that can be included therein are discussed below. In certain embodiments, layers can be patterned. In certain embodiments, layers can be unpatterned.

In certain embodiments, layers can be disposed over a predetermined region of the substrate.

The second electrode can be, for example, a cathode comprising a low work function (e.g., less than 4.0 eV), electron-injecting, metal, such as Al, Ba, Yb, Ca, a lithium-aluminum alloy (Li:Al), a magnesium-silver alloy (Mg:Ag), or lithium fluoride-aluminum (LiF:Al). The second electrode, such as Mg:Ag, can optionally be covered with an opaque protective metal layer, for example, a layer of Ag for protecting the cathode layer from atmospheric oxidation, or a relatively thin layer of substantially transparent ITO. The second electrode can be sandwiched, sputtered, or evaporated onto the exposed surface of the solid layer.

Non-polymeric electrode materials can be deposited by, for example, sputtering or evaporating. Polymeric electrode materials can be deposited by, for example, spin-casting.

One or both of the electrodes can be patterned. Electrode material, including light-transmittable electrode material, can be patterned by, for example, a chemical etching method such as a photolithography or a physical etching method using laser, etc. Also, the electrode may be patterned by vacuum vapor deposition, sputtering, etc. while masking.

The electrodes of the device can be connected to a voltage source by electrically conductive pathways. Upon application of the voltage, light is generated from the device. In certain embodiments, the first electrode may be patterned. In certain embodiments, a blanket first electrode may be used. In certain embodiments, the second electrode may be patterned. In certain embodiments, a blanket second electrode may be used.

In a device structure such as that shown in FIG. 1, for example, the first electrode can have a thickness of about 500 Angstroms to 4000 Angstroms. The first optional charge transport layer can have a thickness of about 50 Angstroms to about 1000 Angstroms. The second optional charge transport layer can have a thickness of about 50 Angstroms to about 1000 Angstroms. The second electrode can have a thickness of about 5 Angstroms to greater than about 10,000 Angstroms.

As discussed above, in the example shown in FIG. 1, light is emitted from the bottom of the structure. If an adequately light transmissive top electrode is used, the structure could emit light from the top of the structure.

Alternatively, the structure of FIG. 1 can be inverted, in which case light can be emitted from the top.

In certain embodiments in which the substrate and all other device materials are transparent, the light-emitting device can be transparent.

Functional light-emitting devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Optionally, one or more of the layers can be patterned. For example, patterned layers (other than the emissive layer) can be deposited by vapor deposition using shadow masks or other masking techniques.

Optionally a desiccant or other moisture absorptive material and/or other moisture and/or oxygen gettering material can be included in the device before it is sealed, e.g., with an epoxy, such as a UV curable epoxy. Desiccants or moisture absorptive materials and other moisture and/or oxygen gettering materials suitable for inclusion in a device can be readily identified by one of ordinary skill in the relevant art.

In certain embodiments, for example, a flexible light-emitting device comprises a an emissive layer comprising semiconductor nanocrystals disposed between a first electrode and a second electrode, supported by a flexible substrate, wherein the emissive material comprises semiconductor nanocrystals capable of emitting light of a predetermined wavelength, wherein, when the device is curved, the emissive layer comprising semiconductor nanocrystals lies substantially in the neutral plane of the device.

In certain embodiments of a flexible light-emitting device in accordance with certain aspects of the invention, the module of the various components or parts of the device are such that, when the device is curved, the neutral axis or neutral plane (i.e., the axis or plane in which no compression or tension exists) lies substantially in the plane of the emissive layer. In certain embodiments, the neutral axis or neutral plane does not deviate from the plane of the emissive layer by more than about 25 percent of the total thickness of the device. In certain embodiments, the neutral axis or neutral plane does not deviate from the plane of the emissive layer by more than about 20 percent of the total thickness of the device. In certain embodiments, the neutral axis or neutral plane does not deviate from the plane of the emissive layer by more than about 15 percent of the total thickness of the device. In certain embodiments, the neutral axis or neutral plane does not deviate from the plane of the emissive layer by more than about 10 percent of the total thickness of the device. In certain embodiments, the neutral axis or neutral plane does not deviate from the plane of the emissive layer by more than about 5 percent of the total thickness of the device. In certain embodiments, the neutral axis or neutral plane does not deviate from the plane of the emissive layer by more than about 1 percent of the total thickness of the device.

In certain embodiments, a device can further includes a third electrode layer disposed on the outside surface of a flexible substrate making electrical contact with either or both interior electrodes through a substrate via or external connection.

The color of the light output of a light-emitting device can be precisely controlled by the selection of the composition, structure, and size of the various semiconductor nanocrystals included in the emissive layer. In certain embodiments, two or more different semiconductor nanocrystals (having different compositions, structures, and/or sizes) can be included.

Light-emitting devices in accordance with embodiments of the invention may be incorporated into a wide variety of products or associated with a wide variety of items, including, but not limited to, large area displays, billboards, lights for interior or exterior illumination and/or signaling, heads up displays, fully transparent displays, a large area wall, theater or stadium screen, sign, ceilings, or other surfaces (e.g., and without limitation, vehicles (such as cars, aircraft, etc.), buildings, etc.) and other objects. Various control mechanisms may be used to control devices fabricated in accordance with the present invention, including passive matrix and active matrix.

A flexible substrate can be opaque, light transmissive, or transparent. In certain embodiments, a flexible substrate can comprise, for example, and without limitation, flexible plastic, metal foil, fiberglass, or semiconductor (e.g., silicon).

In some applications, the substrate can include a backplane. Most preferably, the backplane is flexible. The backplane includes active or passive electronics for controlling or switching power to individual pixels or light-emitting devices. Including a backplane can be useful for applications such as displays, sensors, or imagers. In particular, the backplane can be configured as an active matrix, passive matrix, fixed format, direct drive, or hybrid. The display can be configured for still images, moving images, or lighting. A display including an array of light emitting devices can provide white light, monochrome light, or color-tunable light.

Preferably, a light-emitting device including an emissive material comprising a plurality of semiconductor nanocrystals is processed in a controlled (oxygen-free and moisture-free) environment, preventing the quenching of luminescent efficiency during the fabrication process.

In another embodiment, a light-emitting device includes a sealant dam around the perimeter or device layers on a substrate to form a defined area, and a flexible sealant covering the defined area and at least the uppermost surface of the sealant dam. In certain embodiments, gettering material is associated with (e.g., disposed on, over, under, adjacent, etc.) the device layers before the sealant is included. In certain embodiments, gettering material is disposed over at least a portion of an exposed surface of the device layers. In certain embodiments, gettering material is disposed over at least a portion of the substrate between the substrate and the bottom device layer. In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the light-emitting device comprises one of the devices taught herein. In certain embodiments, the substrate is flexible.

Figure 4:
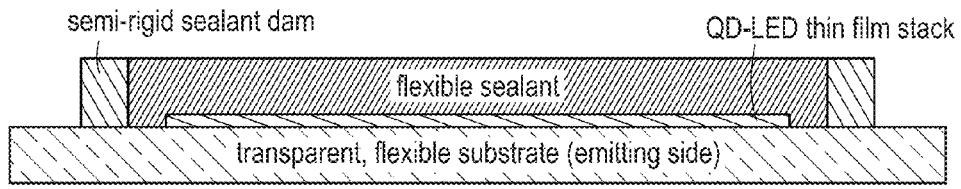
FIG. 4 schematically illustrates an example of an embodiment of the invention including device encapsulation using "dam and fill" technique described herein.

FIG. 4 depicts an example of an embodiment of a flexible light-emitting device of the invention including a sealant dam around the perimeter of device layers on a flexible substrate to form a defined area. In the depicted example, a flexible sealant covers the defined area and at least the uppermost surface of the sealant dam.

In certain embodiments, such light-emitting device can be prepared by a method comprising forming a sealant dam around the perimeter of device layers on a substrate to form a defined area, depositing a flexible sealant over the defined area, and disposing a protective layer over at least the uppermost surface of the sealant dam and sealant. In certain embodiments, the protective layer provides mechanical protection, e.g., against abrasion, handling, other external factors, etc. In certain embodiments, gettering material is associated with (e.g., disposed on, over, under, adjacent, etc.) the device layers before the sealant is deposited over the defined area. In certain embodiments, gettering material is disposed over at least a portion of an exposed surface of the device layers. In certain embodiments, gettering material is disposed over at least a portion of the substrate between the substrate and the bottom device layer. In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the substrate is flexible.

In a preferred embodiment, a "dam and fill" technique includes first printing a patterned dam of semi-rigid epoxy around the display perimeter to be sealed and then coats or prints a flexible sealant to fill the defined area.

A sealant dam preferably comprises a UV- or thermally-activated resin material. Sealants preferably comprising at least one material from a group consisting of photoresist, spin-on glass, polyimide, polybenzoxazole, polyglutarimide, benzocyclobutene, polyethylene, polystyrene, polypropylene, silicon nitride and aluminum oxide. Examples of adhesives and resins that may be useful in various aspect and embodiments of the inventions taught herein include Advanced UV adhesive UV Resin T-470/UR7117LV, UV Resin T-470/UR7117SLV, and UV Resin XNR5516ZHV, available from Nagase ChemteX Corporation, electronics & Structural Materials Department, Hyogo, Japan.

In certain embodiments of the light-emitting devices taught herein, the entire back of a light-emitting device/substrate assembly can optionally be coated with a metallization vapor barrier to further protect the device layers. Examples of such barriers include, for example, commercial OLED encapsulants from companies such as Nagase Chemtex and Epoxy Technology as well as development-grade materials from National Starch.

In another embodiment, a light-emitting device comprises a layer of flexible sealant disposed over exposed (e.g., top and side) surfaces of device layers disposed on surface of a substrate, and a protective layer disposed over the sealant. In certain embodiments, the layer of flexible sealant and/or protective layer also covers a portion of the substrate surface not covered by the device layers. In certain embodiments, the layer of flexible sealant and/or protective layer comprises a continuous layer over the exposed surfaces of the device layers and the portion of the substrate surface not covered by the device layers. In certain embodiments, the protective layer provides mechanical protection, e.g., against abrasion, handling, other external factors, etc. In certain embodiments, gettering material is associated with (e.g., disposed on, over, under, adjacent, etc.) the device layers before the sealant is disposed over the device layers. In certain embodiments, gettering material is disposed over at least a portion of an exposed surface of the device layers. In certain embodiments, gettering material is disposed over at least a portion of the substrate between the bottom device layer and the substrate. In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the light-emitting device comprises one of the devices taught herein. In certain embodiments, the substrate is flexible.

In certain embodiments, such device can be prepared by a method comprising depositing a layer of flexible sealant over exposed (e.g., top and side) surfaces of device layers disposed on a surface of a substrate, and disposing a protective layer over the sealant. In certain embodiments, the layer of flexible sealant and/or protective layer also covers a portion of the substrate surface not covered by the device layers. In certain embodiments, the layer of flexible sealant and/or protective layer comprises a continuous layer over the exposed surfaces of the device layers and the portion of the substrate surface not covered by the device layers. In certain embodiments, the protective layer provides mechanical protection, e.g., against abrasion, handling, other external factors, etc. In certain embodiments, gettering material is associated with (e.g., disposed on, over, under, adjacent, etc.) the device layers before the sealant is disposed over the device layers. In certain embodiments, gettering material is disposed over at least a portion of an exposed surface of the device layers. In certain embodiments, gettering material is disposed over at least a portion of the substrate between the bottom device layer and the substrate. In certain embodiments, the gettering material comprises a layer. In certain embodiments, the gettering material comprises moisture gettering material. In certain embodiments, the gettering material comprises oxygen gettering material. In certain embodiments, the gettering material comprises moisture and oxygen gettering material. In certain embodiments, the gettering material comprises a mixture of two or more gettering materials. In certain embodiments, the substrate is flexible.

Figure 5:
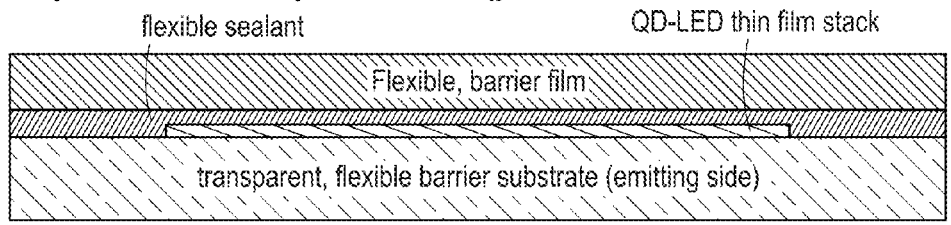
FIG. 5 schematically illustrates an example of an embodiment of the invention including device encapsulation using a laminated back-side barrier film.

FIG. 5 depicts an example of an embodiment of a device including a flexible sealant disposed over exposed (e.g., top and side) surfaces of device layers disposed on surface of a flexible substrate, and a protective layer disposed over the sealant.

In the example depicted in FIG. 5, a flexible barrier film such as Vitex' Barix film or a thin metal film is further laminated to the back side of a flexible light-emitting device assembly using a flexible sealant. Preferably, an air tight seal is achieved. For this package design, an additional encapsulant may be desired or required along the perimeter of the assembly to reduce gas permeation from the edges.

Examples of suitable flexible sealants include, but are not limited to, adhesives, such as a UV-curable epoxy and heat curable epoxies or acrylates. Other materials, techniques, methods, applications, and information that may be useful with the present invention are described in U.S. Pat. No. 7,255,823, issued Aug. 14, 2007, to Guenther, et al., for "Encapsulation For OLED Devices", the disclosure of which is hereby incorporated herein by reference in its entirety. The present invention will be further clarified by the following examples, which are intended to be exemplary of the present invention.

EXAMPLE

Quantum Dot Device Fabricated on Flexible Substrate

A Flexible QD-LED was fabricated as follows:

A flexible substrate (50 mm×50 mm) with patterned indium tin oxide (ITO, 100 Ω/sq.) electrode on one surface (obtained from Delta Tech) is cleaned in an oxygen plasma for about 30 seconds to remove contaminants and oxygenate the surface. The cleaning takes place in 100% oxygen under vacuum (0.1-1.5 torr). The substrate is placed on a water cooled plate to help control the increase in temperature during cleaning.

A layer of hole injection material (PEDOT, obtained from H.C. Starck, GmbH) (HIL) is spun onto the surface of the flexible substrate including the patterned electrode at a speed of 4000 RPM, to a thickness of about 750 Angstroms. This step is carried out under ambient conditions (i.e., not in a glove box). The PEDOT coated substrate is then heated on a 120° C. hot plate in a chamber (<20 ppm water & <10 ppm oxygen), in a HEPA filter environment (approx. Class 1), in a nitrogen atmosphere for >20 minutes to dry the PEDOT. The PEDOT coated substrate is then allowed to cool to room temperature.

A mixture of hole transport material (N,N-bis(3-methylphenyl)-N,N'-bis(phenyl)-spiro (spiro-TPD) (OLED grade, gradient sublimation purified) from Luminescent Technologies, Taiwan)) and Quantum Dots (a mixture of Red: CdSe/CdZnS (octadecylphosphonic acid (ODPA) and decylamine) and Green: CdZnSe/CdZnS (hexylphosphonic acid (HPA)) is created in Toluene (Sigma Aldrich, 99.8% anhydrous). (Red and green-emitting semiconductor nanocrystals are blended together such that when their emission is combined with blue emission from the underlying organic layer, the light output of the device appears white. In this device, the semiconductor nanocrystals are operating in EL mode.) The concentration of spiro-TPD in solution is 10 mg/ml, the ratio of Red to Green quantum dots is 1:2, and the optical densities in solvent/HTL are 0.0015 and 0.003 at first peak for red and green respectively. This material is then spun-coat on the flexible substrate at a speed of 3000 RPM, forming a layer approximately 55 nm thick, which phase separates upon drying to form a distinct layer of HTL (~50 nm) below a distinct layer of QDs (~5 nm). This layer is then baked on a hot plate at 50 C for 15 minutes before being loaded into a vacuum chamber (an ÁMOD chamber, obtained from Angstrom Engineering, Ottawa, Canada) for thermal deposition after the chamber is pumped down to $10^{-6}$ torr or better. (In the figures, spiro-TPD is referred to as E105.) (The Red and Green semiconductor nanocrystals were prepared by methods similar to those described in International Application No. PCT/US2007/013152, filed Jun. 4, 2007, of Coe-Sullivan, et al., for "Light-Emitting Devices And Displays With Improved Performance", the disclosure of which is hereby incorporated herein by reference in its entirety.)

A layer of 2,2',2"-(1,3,5-Benzinetriyl)-tris(1-phenyl-1-H-benzimidazole) (TPBi) (OLED grade, gradient sublimation purified) from Luminescent Technologies, Taiwan) is deposited.

Each of the vapor deposited layers is patterned with use of shadow masks. After deposition of the electron transport material layer, the mask is changed before deposition of the metal cathode, which consists of 5 Å of LiF followed by 1000 Å of Al.

The details of the materials and layer thickness for the flexible QD-LED of this Example are set forth below in Table 1:

TABLE 1

| Flexible QD-LED | Vacuum (torr) | Material | Thickness (Angstroms) |
|---|---|---|---|
| HIL | 0.1-1.5 | PEDOT | 750 Å |
| HTL | 1 Atm | E105 | 500 Å |
| QD | 1 Atm | Mixture of Red & Green Semiconductor Nanocrystals | 50-100 Å |
| ETL | $<10^{-6}$ | TPBi | 500 Å |
| CATHODE | $<10^{-6}$ | LiF | 5 Å |
| TOP LAYER | $<10^{-6}$ | Al | 1000 Å |

Figure 2:
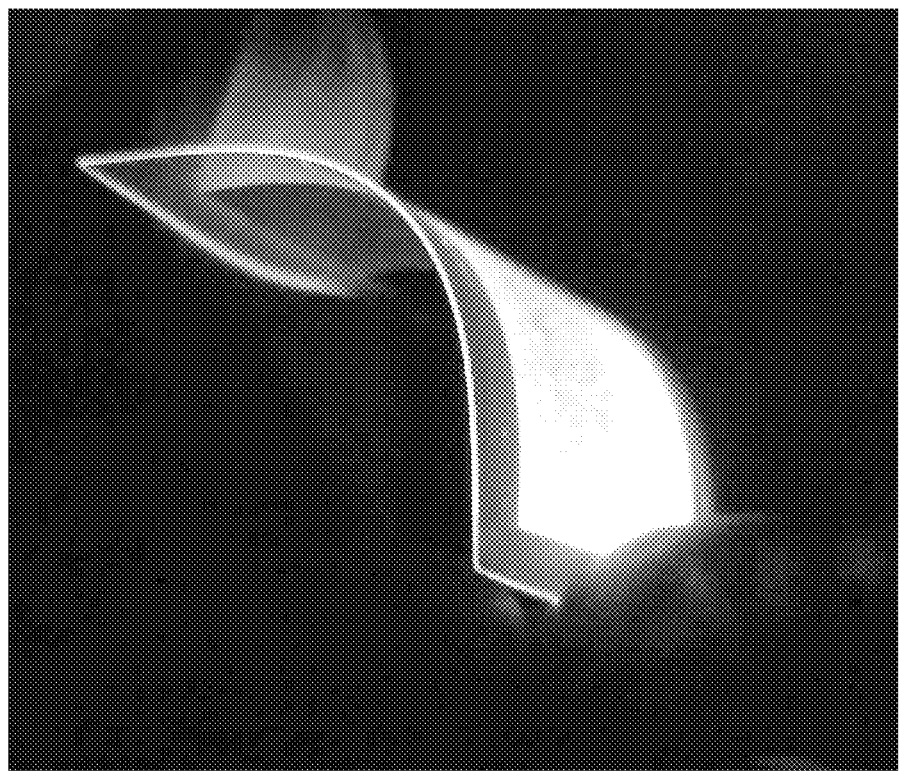
FIG. 2 displays an example of a functioning flexible, white light-emitting display tile embodiment of the invention operating at 9 Volts.
Figure 3:
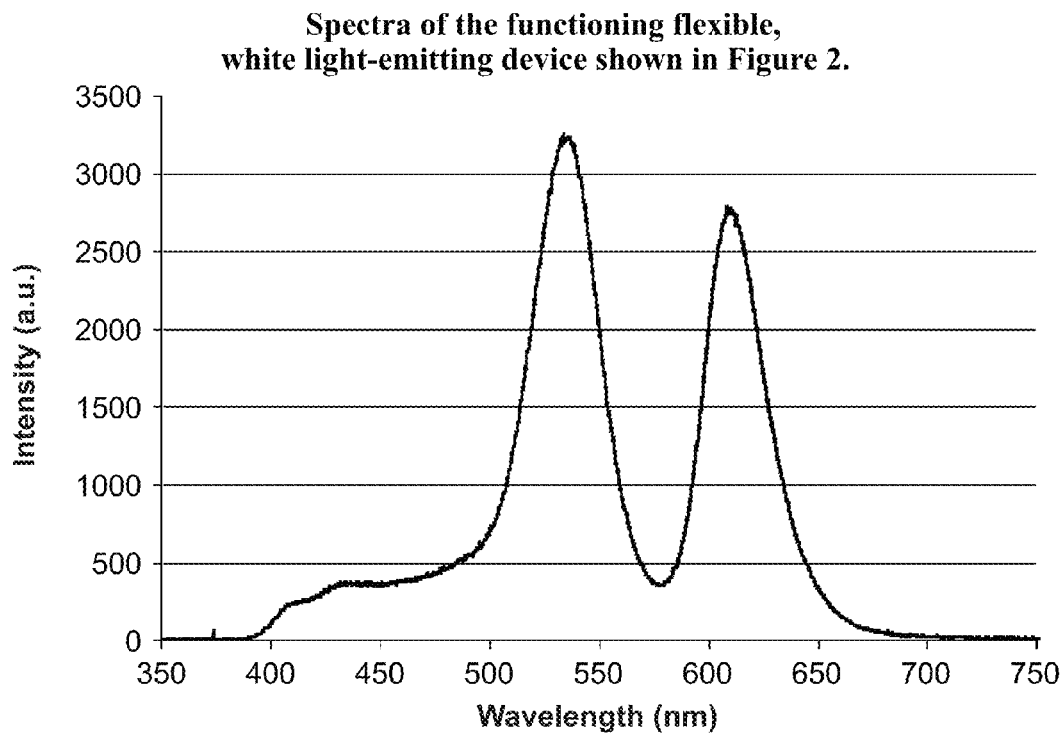
FIG. 3 displays the spectra of the functional flexible, white light-emitting display tile example shown in FIG. 2.

FIG. 2 illustrates an example of an embodiment of a device in accordance with the present invention. The device depicted in FIG. 2 is a functional unpackaged, flexible, white light-emitting light emitting display tile including semiconductor nanocrystals. The tile has an overall substrate dimension is 50×50 mm with an optically active area of 34×34 mm. Table 2 below summarizes the performance data for two devices. The color coordinates were within 9% and 18% percent of the X and Y target specifications, respectively. The EL spectrum of the device shown in FIG. 2 is given in FIG. 3. As mentioned above, in this device, green and red quantum semiconductor nanocrystal (also referred to herein as "quantum dot" or "QD") EL emissions along with blue organic emission provide the white color. In certain embodiments blue-emitting semiconductor nanocrystals may be employed to generate the blue emission to improve the color coordinates.

TABLE 2

Performance data for flexible, white QD-LED display tile

| Substrate | Operating Voltage (V) | Luminance (cd/m$^2$) | CIE Coordinate X | CIE Coordinate Y |
|---|---|---|---|---|
| Tetolight 270 Ω//sq. | 9 | 85.66 | 0.3553 | 0.3991 |
| Delta Tech 100 Ω//sq. | 9 | 56.76 | 0.3602 | 0.3896 |

As discussed above, devices of the invention can be tiled into a large array or display. In a tiled display, additional interconnects can be printed or patterned after QD-LED deposition, before or after encapsulation. Alternatively, interconnects can be patterned prior to the thin film deposition of the transparent conductor and the QD-LED device.

In accordance with another embodiment of the invention, there is provided a system including one or more light-emitting devices or an array of devices taught herein and a sensor, wherein the sensor is in electrical connection with an electronic circuit which is also in electrical connection with the light-emitting device(s). In certain embodiments, the sensor is in close proximity to the light-emitting device. In certain embodiments, the system includes one or more tiles or an array of tiles taught herein and a sensor, wherein the sensor is in electrical connection with an electronic circuit which is also in electrical connection with the tile(s)

In certain embodiments, the sensor comprises an optical sensor. In certain embodiments, the sensor comprises a temperature sensor. In certain embodiments, the sensor comprises a photoconductor. In certain embodiments, the sensor comprises a radio frequency sensor. In certain embodiments, the sensor comprises a capacitive sensor. In certain embodiments, the sensor is a color sensor. In certain embodiments, the sensor comprises a chemical sensor. In certain embodiments, the sensor comprises a biological sensor. In certain embodiments, the sensor comprises an acoustic sensor.

In certain embodiments, the sensor comprises more than one sensor.

In certain embodiments, the sensor comprises more than one type of sensor.

In certain embodiments, the sensor is on the same surface of the flexible substrate as the light-emitting device. In certain of such embodiments wherein the sensor is optically sensitive, the sensor can collect light from the same surface of the flexible substrate as the light-emitting device.

In certain embodiments, the sensor is on the opposite side of the substrate from the light-emitting device. In certain of such embodiments wherein the sensor is optically sensitive, the sensor can collect light from the opposite side of the substrate from the light-emitting device.

In certain embodiments, the sensor is adjacent to the light-emitting device. In certain of such embodiments wherein the sensor is optically sensitive, the sensor collects light adjacent to the light-emitting device.

In certain embodiments wherein the sensor is optically sensitive, the sensor includes a narrow-band optical filter. In certain embodiments, the sensor includes a wide-band optical filter. In certain embodiments wherein the sensor is optically sensitive, the sensor may include more than one optical sensor, each of which can include a different optical filter that is either narrow-band or wide-band to sense the color of the light being monitored. In certain embodiments, each optical sensor can includes the same optical filter, which can be narrow-band or wide-band to sense the color of the light being monitored. In certain embodiments, ambient light is being monitored.

In certain embodiments, the electronic circuit controls the brightness level of the light-emitting device. In certain embodiments, the electronic circuit controls the color of the light-emitting device. In certain embodiments, the electronic circuit controls both the brightness level and color of the light-emitting device.

In certain embodiments, the electronic circuit comprises an amplifier that controls light-emitting device brightness. In certain embodiments, the electronic circuit comprises one or more transistors. In certain embodiments, the electronic circuit comprises one or more passive elements such as a resistor, capacitor or inductor.

In certain embodiments, the system further includes a controller coupled to the light-emitting device and at least one sensor, the controller being configured to process information acquired by the at least one sensor to control the light-emitting device to generate a light output with a predetermined characteristic. In certain embodiments, a predetermined characteristic can comprise color, brightness, or other light characteristic.

The above-described system can be incorporated into a wide variety of products or associated with a wide variety of items, including, but not limited to, large area displays, billboards, lights for interior or exterior illumination and/or signaling, heads up displays, fully transparent displays, a large area wall, theater or stadium screen, sign, ceilings, or other surfaces (e.g., and without limitation, vehicles (such as cars, aircraft, etc.), buildings, etc.) and other objects. Various control mechanisms may be used to control devices fabricated in accordance with the present invention, including passive matrix and active matrix.

Other materials, techniques, methods, applications, and information that may be useful with the system of the present invention are described in U.S. Pat. No. 7,132,635 of Dowling, granted 7 Nov. 2006; U.S. Pat. No. 7,199,344 of Blake, granted 3 Apr. 2007; and U.S. Pat. No. 6,459,076 of Schlenker, granted 1 Oct. 2002, each of foregoing being hereby incorporated herein by reference in its entirety.

Semiconductor nanocrystals include, for example, inorganic crystallites between about 1 nm and about 1000 nm in diameter. In certain embodiments the diameter is from about 2 nm and about 50 nm. In certain embodiments, the diameter is from about 5 nm to about 20 nm (such as about 5, 6, 7, 8, 9, 10, 11, 12, 13, 14, 15, 16, 17, 18, 19, or 20 nm).

The semiconductor forming the semiconductor nanocrystals can comprise a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

Examples of the shape of the semiconductor nanocrystals include sphere, rod, disk, other shape or mixtures thereof.

Preferably, the semiconductor nanocrystals include a "core" of one or more first semiconductor materials, which may be surrounded by an overcoating or "shell" of one or more second semiconductor materials. A semiconductor nanocrystal core surrounded by a semiconductor shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing.

For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. An overcoating may comprise one or more layers. An overcoating may comprise at least one semiconductor material which is the same as or different from the composition of the core. Preferably, an overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell.

Additional examples of core/shell semiconductor structures are described in U.S. Published Patent Application No. US 2004-0023010 A1, for "Light Emitting Device Including Semiconductor Nanocrystals" of Bulovic et al. The foregoing application is hereby incorporated herein by reference in its entirety.

Preparation and manipulation of semiconductor nanocrystals are described, for example, in U.S. Pat. Nos. 6,322, 901 and 6,576,291, and U.S. Patent Application No. 60/550, 314, each of which is hereby incorporated herein by reference in its entirety. One example of a method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

In certain embodiments, the preparation of semiconductor nanocrystals can be carried out in the presence of an amine. See, for example, U.S. Pat. No. 6,576,291 for "Preparation of Nanocrsytallites" of Bawendi et al. issued 10 Jun. 2003, which is hereby incorporated herein by reference in its entirety.

Alternatively, semiconductor nanocrystals can be prepared in a non-coordinating solvent.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing are hereby incorporated herein by reference in their entireties.

In processes involving a coordinating solvent, the process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. The X donor can be a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-noctylphosphine) sulfide (TOPS), an ammonium salt such as an ammonium halide (e.g., NH4Cl), tris(trimethylsilyl)phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

A coordinating solvent can help control the growth of the semiconductor nanocrystal. The coordinating solvent is a compound having a donor lone pair that, for example, has a lone electron pair available to coordinate to a surface of the growing semiconductor nanocrystal. Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl)phosphite, triisodecyl phosphite, bis(2-ethylhexyl)phosphate, tris(tridecyl)phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

As discussed herein, semiconductor nanocrystals preferably have ligands attached thereto.

In certain embodiment, the ligands can be derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

Organic ligands can be useful in facilitating large area, non-epitaxial deposition of highly stable inorganic nanocrystals within a device.

In certain embodiments, a coordinating ligand can have the formula:

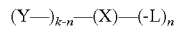

$$(Y\text{---})_{k-n}\text{---}(X)\text{---}(\text{-L})_n$$

wherein k is 2, 3 4, or 5, and n is 1, 2, 3, 4 or 5 such that k−n is not less than zero; X is O, O—S, O—Se, O—N, O—P, O—As, S, S=O, SO2, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxyalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry, which is hereby incorporated by reference in its entirety.

Other ligands are described in U.S. patent application Ser. No. 10/641,292 for "Stabilized Semiconductor Nanocrystals", filed 15 Aug. 2003, which is hereby incorporated herein by reference in its entirety.

When an electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of semiconductor nanocrystals shift to the blue, or to higher energies, as the size of the crystallites decreases.

The emission from a semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region. The narrow size distribution of a population of semiconductor nanocrystals can result in emission of light in a narrow spectral range. The population can be monodisperse preferably exhibits less than a 15% rms (root-mean-square) deviation in diameter of the semiconductor nanocrystals, more preferably less than 10%, most preferably less than 5%. Spectral emissions in a narrow range of no greater than about 75 nm, preferably 60 nm, more preferably 40 nm, and most preferably 30 nm full width at half max (FWHM) for semiconductor nanocrystals that emit in the visible can be observed. IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of semiconductor nanocrystal diameters decreases. Semiconductor nanocrystals can have high emission quantum efficiencies such as greater than about 10%, greater than about 20%, greater than about 30%, greater than about 40%, greater than about 50%, greater than about 60%, greater than about 70%, or greater than about 80%.

The narrow FWHM of semiconductor nanocrystals can result in saturated color emission. This can lead to efficient lighting devices even in the red and blue parts of the visible spectrum, since in semiconductor nanocrystal emitting devices no photons are lost to infra-red and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A device including semiconductor nanocrystals of different compositions, sizes, and/or structures can emit light in more than one narrow range of wavelengths. The color of emitted light perceived by a viewer can be controlled by selecting appropriate combinations of semiconductor nanocrystal sizes and materials in the device as well as relative subpixel currents. The degeneracy of the band edge energy levels of semiconductor nanocrystals facilitates capture and radiative recombination of all possible excitons, whether generated by direct charge injection or energy transfer. The maximum theoretical semiconductor nanocrystal lighting device efficiencies are therefore comparable to the unity efficiency of phosphorescent organic light-emitting devices. The excited state lifetime ($\tau$) of the semiconductor nanocrystal is much shorter ($\tau \sim 10$ ns) than a typical phosphor ($\tau > 0.1$ µs), enabling semiconductor nanocrystal lighting devices to operate efficiently even at high current density and high brightness.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

In certain embodiments, the emissive material can be deposited as one or more separate layers. In certain embodiments, a layer comprising emissive material can be disposed between any two layers of the device. For example, the layer comprising emissive material can be disposed between two hole transport layers and/or between two electron transport layers. In either case, each of the charge transport layers may further comprise one or more layers. In another embodiment, the emissive material can be deposited as one or more separate layers disposed between a hole transport layer and an electron transport layer. As discussed elsewhere herein, other layers may also be included between the electron transport layers and the hole transport layers. When included in the device as a separate layer, for example, an emissive layer comprising semiconductor nanocrystals can be disposed as a continuous or substantially continuous thin film or layer. When disposed as a separate layer, the layer can be patterned or unpatterned. Preferably, an emissive layer comprising semiconductor nanocrystals comprises a substantially monodisperse population of semiconductor nanocrystals.

In certain embodiments, an emissive layer comprising semiconductor nanocrystals is deposited at a thickness of multiple monolayers or less. For example, the thickness can be greater than three monolayers, three or less monolayers, two or less monolayers, a single monolayer, a partial monolayer, etc. The thickness of each deposited layer of semiconductor nanocrystals may vary. In certain embodiments, the variation of the thickness at any point of the deposited semiconductor nanocrystals is less than three monolayers. In certain embodiments, the variation of the thickness at any point of the deposited semiconductor nanocrystals is less than two monolayers. In certain embodiments, the variation of the thickness at any point of the deposited semiconductor nanocrystals is less than one monolayer. When deposited as a single monolayer, in certain embodiments at least about 60% of the semiconductor nanocrystals are at single monolayer thickness; in certain embodiments at least about 80% of the semiconductor nanocrystals are at single monolayer thickness; and in certain embodiments at least about 90% of the semiconductor nanocrystals are at single monolayer thickness. In a light-emitting device, a monolayer can provide the beneficial light emission properties of semiconductor nanocrystals while minimizing the impact on electrical performance.

Semiconductor nanocrystals show strong quantum confinement effects that can be harnessed in designing bottom-up chemical approaches to create complex heterostructures with electronic and optical properties that are tunable with the size and composition of the semiconductor nanocrystals.

As discussed herein, in certain embodiments, emissive material comprising a plurality of semiconductor nanocrystals can be deposited in a patterned arrangement. Patterned semiconductor nanocrystals can be used to form an array of light-emitting devices comprising, e.g., red, green, and blue, or alternatively, red, orange, yellow, green, blue-green, blue, violet, or other visible, infrared, or ultraviolet emitting, or other combinations of distinguishable wavelength emitting devices, that are energized to produce light of a predetermined wavelength.

A device or array of devices capable of emitting a variety of colors includes a pattern of emissive materials capable of emitting different colors.

When deposited in a patterned arrangement, the emissive layer can comprise a pattern comprising features having at least one dimension at a micron-scale (e.g., less than 1 mm, less than 500 µm, less than 200 µm, less than 100 µm or less, less than 50 µm or less, less than 20 µm or less). The emissive layer can also comprise a patterned arrangement comprising features at greater than micron-scale. The emissive layer can also comprise a patterned arrangement comprising features at less than micron-scale.

A pattern comprising deposited emissive material having features on the micron scale may also be referred to herein as a micropattern. A micropattern can have features on the micron scale, such as less than 1 mm, less than 500 µm, less than 200 µm, less than 100 µm, less than 50 µM, or 20 µm or less in size. A 20 µm feature size or smaller is suitable for many light emitting devices.

The size of a display can have dimensions of >1 mm, 1 cm or greater, 10 cm or greater, 100 cm or greater, or 1,000 cm or greater.

Optionally, devices can be stitched (or tiled) together, to expand display sizes from, e.g., 12" squares, to 'n×12" squares' as is frequently done in the semiconductor lithography field.

Contact printing provides a method for applying a material to a predefined region on a surface to be printed. The predefined region is a region on a surface where the material is selectively applied. The material and substrate can be chosen such that the material remains substantially entirely within the predetermined area. By selecting a predefined region that forms a pattern, material can be applied to a surface such that the material forms a pattern. The pattern can be a regular pattern (such as an array, or a series of lines), or an irregular pattern. Once a pattern of material is formed on a surface, the surface can have a region including the material (the predefined region) and a region substantially free of material. In some circumstances, the material forms a monolayer on the surface. The predefined region can be a discontinuous region. In other words, when the material is applied to the predefined region of the surface, locations including the material can be separated by other locations that are substantially free of the material.

Microcontact printing and related techniques are described in, for example, U.S. Pat. Nos. 5,512,131; 6,180,239; and 6,518,168, each of which is incorporated by reference in its entirety. In some circumstances, the stamp can be a featureless stamp having a pattern of ink, where the pattern is formed when the ink is applied to the stamp. See U.S. patent application Ser. No. 11/253,612, filed Oct. 21, 2005, which is incorporated by reference in its entirety.

Other materials, techniques, methods, applications, and information that may be useful with the present invention are described in, International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2007/09255, filed Apr. 13, 2007, of Anc, et al., for "Methods Of Depositing Material, Methods Of Making A Device, And System"; International Application No. PCT/US2007/003411, filed Feb. 8, 2007, of Beatty, et al., for "Device Including Semiconductor Nanocrystals And A Layer Including A Doped Organic Material And Methods"; International Application No. PCT/US2007/14711, filed Jun. 25, 2007, of Coe-Sullivan, for "Methods For Depositing Nanomaterial, Methods For Fabricating A Device, And Methods For Fabricating An Array Of Devices"; International Application No. PCT/US2007/14705, filed Jun. 25, 2007, of Coe-Sullivan, et al., for "Methods For Depositing Nanomaterial, Methods For Fabricating A Device, Methods For Fabricating An Array Of Devices And Compositions"; International Application No. PCT/US2007/008705, filed Apr. 9, 2007, of Coe-Sullivan, et al., for "Methods And Articles Including Nanomaterial"; International Application No. PCT/US2007/014706, filed Jun. 25, 2007, of coe-sullivan, et al., for "Methods And Articles Including Nanomaterial"; International Application No. PCT/US2007/003525, filed Feb. 8, 2007, of Coe-Sullivan, et al., for "Displays Including Semiconductor Nanocrystals And Methods Of Making Same"; International Application No. PCT/US2007/008721, filed Apr. 9, 2007, of Cox, et al., for "Methods Of Depositing Nanomaterial & Methods Of Making A Device"; International Application No. PCT/US2007/019797, filed Sep. 12, 2007, of Coe-Sullivan, et al., for "A Composite Including Nanoparticles, Methods, And Products Including A Composite"; International Application No. PCT/US2007/019796, of Coe-Sullivan, et al., filed Sep. 12, 2007, for "Electroluminescent Display Useful For Displaying A Predetermined Pattern"; International Application No. PCT/US2007/24320, filed Nov. 21, 2007, of Clough, et al., for "Nanocrystals Including A Group In a Element And A Group Va Element, Method, Composition, Device And Other Products"; U.S. Patent Application No. 60/971,887, filed Sep. 12, 2007, of Breen, et al., for "Functionalized Semiconductor Nanocrystals And Method"; U.S. Patent Application No. 60/992,598, filed Dec. 5, 2007, of Breen, et al., "Functionalized Semiconductor Nanocrystals And Method"; International Application No. PCT/US2008/010651, filed Sep. 12, 2008, of Breen, et al., for "Functionalized Nanoparticles And Method"; International Application No. PCT/US2007/24305, filed Nov. 21, 2007, of Breen, et al., for "Blue Light Emitting Semiconductor Nanocrystal And Compositions And Devices Including Same"; International Application No. PCT/US2007/24306, filed Nov. 21, 2007, of Ramprasad, for "Semiconductor Nanocrystal And Compositions And Devices Including Same"; International Application No. PCT/US2007/013152, filed Jun. 4, 2007, of Coe-Sullivan, et al., for "Light-Emitting Devices And Displays With Improved Performance"; International Application No. PCT/US2007/24750, of Coe-Sullivan, et al., filed Dec. 3, 2007 "Improved Composites And Devices Including Nanoparticles"; International Application No. PCT/US2007/24310, filed Nov. 21, 2007, of Kazlas, et al., for "Light-Emitting Devices And Displays With Improved Performance"; and International Application No. PCT/US2007/003677, filed Feb. 14, 2007, of Bulovic, et al., for "Solid State Lighting Devices Including Semiconductor Nanocrystals & Methods". The disclosures of each of the foregoing listed patent documents are hereby incorporated herein by reference in their entireties.

Hole transport and electron transport layers mentioned above can be collectively referred to as charge transport layers. Either or both of these layers can comprise organic or inorganic materials. Examples of inorganic material include, for example, inorganic semiconductors. The inorganic material can be amorphous or polycrystalline. An organic charge transport material can be polymeric or non-polymeric.

An example of a typical organic material that can be included in an electron transport layer includes a molecular matrix. The molecular matrix can be non-polymeric. The molecular matrix can include a small molecule, for example, a metal complex. The metal complex of 8-hydroxyquinoline can be an aluminum, gallium, indium, zinc or magnesium complex, for example, aluminum tris(8-hydroxyquinoline) ($Alq_3$). In certain embodiments, the electron transport material can comprise LT-N820 or LT-N821 (1,3-Bis[2-(2,2'-bypyridine-6-yl)-1,3,4-oxadiazo-5-yl]benzene (also abbreviated as Bpy-OXD), available from Luminescent Technologies, Taiwan. For additional information relating to Bpy-OXD, see M. Ichikawa et al., J. Mater. Chem., 2006, 16, 221-25, the disclosure of which is hereby incorporated herein by reference in its entirety. Other classes of materials in the electron transport layer can include metal thioxinoid compounds, oxadiazole metal chelates, triazoles, sexithiophenes derivatives, pyrazine, and styrylanthracene derivatives. An electron transport layer comprising an organic material may be intrinsic (undoped) or doped. Doping may be used to enhance conductivity.

An example of a typical organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include spiro-TPD, 4-4'-N,N'-dicarbazolyl-biphenyl (CBP), 4,4-.bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, or an N,N, N',N'-tetraarylbenzidine. A hole transport layer comprising an organic material may be intrinsic (undoped) or doped. Doping may be used to enhance conductivity.

Charge transport layers comprising organic materials and other information related to fabrication of organic charge transport layers are discussed in more detail in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005. The foregoing patent applications are hereby incorporated herein by reference in its entirety.

Organic charge transport layers may be disposed by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Most preferably, the organic layers are deposited at high vacuum conditions from about $1 \times 10^{-7}$ to about $5 \times 10^{-6}$ torr. Alternatively, organic layers may be formed by multi-layer coating while appropriately selecting solvent for each layer. Examples of charge transport layers that can be solvent cast include but are not limited to fluorene-based polymers such as Poly(9,9'-dioctylfluorene-co-bis-N,N'-(4-butylphenyl)-bis-N,N'-phenyl-1,4-phenylene-diamine) (PFB) and poly(9,9'-dioctylfluorene-co-N-(4-butylphenyl)diphenylenediamine) (TFB).

Charge transport layers including inorganic materials and other information related to fabrication of inorganic charge transport layers are discussed further below and in more detail in U.S. Patent Application No. 60/653,094 for "Light Emitting Device Including Semiconductor Nanocrystals", filed 16 Feb. 2005 and U.S. patent application Ser. No. 11/354,185, filed 15 Feb. 2006, the disclosures of each of which are hereby incorporated herein by reference in their entireties.

Charge transport layers comprising an inorganic semiconductor can be deposited on a substrate at a low temperature, for example, by a known method, such as a vacuum vapor deposition method, an ion-plating method, sputtering, inkjet printing, etc.

In addition to the charge transport layers, a device may optionally further include one or more charge-injection layers, e.g., a hole-injection layer (either as a separate layer or as part of the hole transport layer) and/or an electron-injection layer (either as a separate layer as part of the electron transport layer). Charge injection layers comprising organic materials can be intrinsic (un-doped) or doped. One or more charge blocking layers may still further optionally be included. For example, an electron blocking layer (EBL), a hole blocking layer (HBL), or an exciton blocking layer (eBL), can be introduced in the structure. A blocking layer can include, for example, 3-(4-biphenylyl)-4-phenyl-5-tert butylphenyl-1,2,4-triazole (TAZ), 3,4,5-triphenyl-1,2,4-triazole, 3,5-bis(4-tertbutylphenyl)-4-phenyl-1,2,4-triazole, bathocuproine (BCP), 4,4',4"-tris {N-(3-methylphenyl)-Nphenylamino}triphenylamine (m-MTDATA), polyethylene dioxythiophene (PEDOT), 1,3-bis(5-(4-diphenylamino) phenyl-1,3,4-oxadiazol-2-yl)benzene, 2-(4-biphenylyl)-5-(4-tertbutylphenyl)-1,3,4-oxadiazole, 1,3-bis[5-(4-(1,1-dimethylethyl)phenyl)-1,3,4-oxadiazol-5,2-yl)benzene, 1,4-bis(5-(4-diphenylamino)phenyl-1,3,4-oxadiazol-2-yl) benzene, 1,3,5-tris[5-(4-(1,1-dimethylethyl)phenyl)-1,3,4-oxadiazol-2-yl)benzene, or 2,2',2"-(1,3,5-Benzinetriyl)-tris (1-phenyl-1-H-benzimidazole) (TPBi).

Charge blocking layers comprising organic materials can be intrinsic (un-doped) or doped.

The charge injection layers (if any), and charge blocking layers (if any) can be deposited on a surface of one of the electrodes by spin coating, dip coating, vapor deposition, or other thin film deposition methods. See, for example, M. C. Schlamp, et al., J. Appl. Phys., 82, 5837-5842, (1997); V. Santhanam, et al., Langmuir, 19, 7881-7887, (2003); and X. Lin, et al., J. Phys. Chem. B, 105, 3353-3357, (2001), each of which is incorporated by reference in its entirety.

Other multilayer structures may optionally be used to improve the performance (see, for example, U.S. patent application Ser. Nos. 10/400,907 and 10/400,908, filed Mar. 28, 2003, each of which is incorporated by reference in its entirety) of the light-emitting devices and displays of the invention. The performance of light-emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety.

The specific materials and structures described herein are exemplary in nature, and other materials and structures may be used. The present invention will be further clarified by the following examples, which are intended to be exemplary of the present invention.

As used herein, "top" and "bottom" are relative positional terms, based upon a location from a reference point. More particularly, "top" means furthest away from the reference point, while "bottom" means closest to the reference point. For example, for a light-emitting device that optionally includes two electrodes, if the substrate is selected as the reference point, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from the substrate. There may be other layers between the first and second layer, unless it is otherwise specified. For example, a cathode may be described as "disposed over" an anode, even though there are various organic and/or inorganic layers in between.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the specification and practice of the invention disclosed herein. It is intended that the specification and examples be considered as exemplary only, with a true scope and spirit of the invention being indicated by the following claims and equivalents thereof.

What is claimed is:

1. A flexible light-emitting device including an emissive layer formed of one or more distinct layers of inorganic semiconductor nanocrystals disposed between two flexible substrates, wherein the emissive layer does not include a matrix material, a first electrode disposed over the emissive layer and a second electrode disposed under the emissive layer, wherein the moduli of the various parts of the device are such that, when the device is curved, the neutral plane of the device lies substantially in the plane of the emissive layer.

2. A light-emitting device in accordance with claim 1 wherein the neutral plane does not deviate from the plane of the emissive layer by more than about 25 percent of the total thickness of the device.

3. A light-emitting device in accordance with claim 1 wherein the neutral plane does not deviate from the plane of the emissive layer by more than about 20 percent of the total thickness of the device.

4. A light-emitting device in accordance with claim 1 wherein the neutral plane does not deviate from the plane of the emissive layer by more than about 15 percent of the total thickness of the device.

5. A light-emitting device in accordance with claim 1 wherein the neutral plane does not deviate from the plane of the emissive layer by more than about 10 percent of the total thickness of the device.

6. A light-emitting device in accordance with claim 1 wherein the neutral plane does not deviate from the plane of the emissive layer by more than about 5 percent of the total thickness of the device.

7. A light-emitting device in accordance with claim 1 wherein the neutral plane does not deviate from the plane of the emissive layer by more than about 1 percent of the total thickness of the device.

8. A tile comprising a light-emitting device in accordance with claim 1.

9. An array comprising two or more light-emitting devices in accordance with claim 1, wherein the devices are in electrical connection.

10. A system including a light-emitting device in accordance with claim 1 and at least one sensor, wherein the at least one sensor is in electrical connection with an electronic circuit which is also in electrical connection with the light-emitting device.

11. A system in accordance with claim 10 further including a controller coupled to the light-emitting device and the at least one sensor, the controller being configured to process information acquired by the sensor to control the light-emitting device to generate a light output with at least one predetermined characteristic.

12. A light-emitting device in accordance with claim 1 wherein the emissive layer is patterned.

13. A flexible light-emitting device including: a flexible substrate, an assembly of device layers including a first electrode disposed over a portion of the flexible substrate, an emissive layer formed of one or more distinct layers of inorganic semiconductor nanocrystals disposed over the first electrode, wherein the emissive layer does not include a matrix material, and a second electrode disposed over the emissive layer, a layer of flexible sealant disposed over at least exposed surfaces of the device layer assembly, and a protective layer disposed over the layer of flexible sealant, wherein the moduli of the various parts of the device are such that, when the device is curved, the neutral plane of the device lies substantially in the plane of the emissive layer.

14. A light-emitting device in accordance with claim 13 wherein the neutral plane does not deviate from the plane of the emissive layer by more than about 25 percent of the total thickness of the device.

15. A light-emitting device in accordance with claim 13 wherein the neutral plane does not deviate from the plane of the emissive layer by more than about 20 percent of the total thickness of the device.

16. A light-emitting device in accordance with claim 13 wherein the neutral plane does not deviate from the plane of the emissive layer by more than about 15 percent of the total thickness of the device.

17. A light-emitting device in accordance with claim 13 wherein the neutral plane does not deviate from the plane of the emissive layer by more than about 10 percent of the total thickness of the device.

18. A light-emitting device in accordance with claim 13 wherein the neutral plane does not deviate from the plane of the emissive layer by more than about 5 percent of the total thickness of the device.

19. A light-emitting device in accordance with claim 13 wherein the neutral plane does not deviate from the plane of the emissive layer by more than about 1 percent of the total thickness of the device.

20. A tile comprising a light-emitting device in accordance with claim 13.

21. An array comprising two or more light-emitting devices in accordance with claim 13, wherein the devices are in electrical connection.

22. A system including a light-emitting device in accordance with claim 13 and at least one sensor, wherein the at least one sensor is in electrical connection with an electronic circuit which is also in electrical connection with the light-emitting device.

23. A system in accordance with claim 22 further including a controller coupled to the light-emitting device and the at least one sensor, the controller being configured to process information acquired by the sensor to control the light-emitting device to generate a light output with at least one predetermined characteristic.

24. A light-emitting device in accordance with claim 13 further comprising a third electrode layer disposed on the outside surface of the flexible substrate making electrical contact with either or both interior electrodes through a substrate via or external connection.

25. A light-emitting device in accordance with claim 13 further including a sealant dam around the perimeter of device layers disposed on the flexible substrate to form a defined area, wherein the flexible sealant covers the defined area and at least the uppermost surface of the sealant dam.

26. A light-emitting device in accordance with claim 13 wherein the emissive layer is patterned.

27. A light-emitting device in accordance with claim 13 further including a gettering material comprising an oxygen gettering material associated with the device layer assembly.

* * * * *